United States Patent
Gradenwitz

[11] Patent Number: 5,986,308
[45] Date of Patent: Nov. 16, 1999

[54] MOS TRANSISTOR WITH A PROTECTION DIODE

[75] Inventor: Paul G.M. Gradenwitz, Zurich, Switzerland

[73] Assignee: U.S. Philips Corporation, New York, N.Y.

[21] Appl. No.: 09/256,479

[22] Filed: Feb. 23, 1999

[30] Foreign Application Priority Data

Feb. 25, 1998 [EP] European Pat. Off. .............. 98200597

[51] Int. Cl.$^6$ .................................................. H01L 23/62
[52] U.S. Cl. ........................................... 257/362; 257/356
[58] Field of Search .................................. 257/355, 356, 257/357, 362

[56] References Cited

U.S. PATENT DOCUMENTS

| | | |
|---|---|---|
| 4,922,316 | 5/1990 | Sato . |
| 5,366,908 | 11/1994 | Pelella ........................................ 457/34 |
| 5,844,282 | 12/1998 | Noguchi ................................. 257/356 |
| 5,900,664 | 5/1999 | En ........................................... 257/356 |

Primary Examiner—Ngân V. Ngô
Attorney, Agent, or Firm—Steven R. Biren

[57] ABSTRACT

In the manufacture of integrated circuits, damage to transistors caused by ESD is customarily precluded by connecting the gates of the transistors, in an early stage, to a protection diode. If, for example during plasma etching or reactive ion etching, an electric charge is stored on a floating gate, this charge can be removed via the diode before electric breakdown occurs. In a first embodiment of a device in accordance with the invention, the diode is formed in an active region covered by an electrically insulating layer 12. The gate 8, or a poly track 9 connected thereto, projects above this layer and covers only a part of the active region. In the uncovered part of the active region, a cathode or anode is provided so as to be self-aligned relative to the poly track. In another embodiment, the poly track 9 is situated directly next to the region of the diode. The poly track 9 and the surface zone 10 of the protection diode are interconnected by an overlapping metal contact 15. The diode can be manufactured by means of the same process steps as those necessary to manufacture the transistor. In addition, the surface area occupied by the diode can be kept very small.

5 Claims, 4 Drawing Sheets

MOS TRANSISTOR WITH A PROTECTION DIODE

BACKGROUND OF THE INVENTION

The invention relates to a semiconductor device comprising a semiconductor body which is provided at a surface with a MOS transistor having a gate which is electrically insulated from an underlying channel region by an intermediate gate dielectric, and, in a neighboring region of a first conductivity type, a surface zone of a second, opposite conductivity type is formed which is conductively connected to the gate and which forms a protection diode with the adjacent region of the semiconductor body, via which protection diode electric charge is removed from the gate before the gate dielectric is damaged as a result of electrostatic discharge.

Such a device is known, inter alia, from the patent U.S. Pat. No. 5,366,908.

In the manufacture of CMOS and BICMOS type integrated circuits, it is customary to grow, in a first phase of the process, the thin gate oxide having a specific thickness of, for example, 10 nm, whereafter the gates, customarily of doped polycrystalline silicon, are provided thereon, and subsequently the source and drain zones of the transistors are formed in the semiconductor body. In a next phase, the whole structure is provided with a dielectric layer, for example an oxide layer, whereafter the wiring in the form of one or more metal layers is formed in order to connect the different components of the circuit to each other and to bonding pads enabling external connections to be made. As the dimensions are becoming smaller and smaller (submicron) and the number of components as well as the complexity of the circuits are increasing continuously, the number of metal layers tends to increase and amounts to at least four in current circuits.

During the wiring process, connections can be made which are electrically floating until they are connected again by the last wiring layer. In the meantime, however, electric charge caused, for example, by plasma etching, may accumulate on these floating connections. If one of these connections is coupled to the polygate of a transistor, the charge may leak to the substrate via the thin gate oxide, whereby it may exceed a maximum value and, thus, cause irreparable damage to the gate oxide.

To preclude premature breakdown of the gate oxide, said patent U.S. Pat. No. 5,366,908 already proposes to connect the polygate to a diode formed in the semiconductor body. If, during the production process, electric charge is stored on the electrically floating gate, this charge can be removed via the diode before causing damage to the gate oxide.

Since the number of transistors may be very large, it is important that the dimensions of the diode are as small as possible so as to preclude that the surface of the circuit becomes too large. In addition, it is important that the diode should be compatible with the rest of the circuit and, preferably, can be manufactured with the same process steps as the transistors. In the known device, the connection between the diode and the polygate takes the form of a CS contact in which the poly is directly deposited, at the location of the diode, on the locally exposed surface of the semiconductor body. In the manufacture of this device, the gate oxide grown is provided with a thin polylayer which serves to protect said gate oxide. A window which defines the position of the diode is subsequently provided in this polylayer and the underlying gate oxide. Next, a second polysilicon layer is deposited which contacts the silicon body at the location of the window. By means of a doping step, the polylayer is provided with an n-type doping, and, simultaneously, the protection diode is formed at the location of the CS contact in the semiconductor body. In a subsequent series of process steps, the poly is provided with a pattern, whereafter the source and drain zones of the transistors are formed in a customary manner. The process includes process steps, such as the provision of the first, protective polylayer and the provision of the window at the location of the diode, which process steps are required only in connection with the diode and add to the complexity of the production process.

SUMMARY OF THE INVENTION

It is an object of the invention to provide, inter alia, a CMOS or BICMOS-type integrated circuit with a protective diode which occupies little space and the manufacture of which does not require additional process steps. To achieve this, a semiconductor device of the type described in the opening paragraph is characterized, in accordance with the invention, in that the gate extends in the form of a conductor track over the surface at least almost up to the neighboring region, so that, viewed on the surface, the conductor track and the surface zone are juxtaposed, the entire surface being provided with a dielectric layer which is provided, at the location of the diode, with a contact window extending partly above the conductor track and partly above the surface region, in which contact window a metal contact forming a conductive connection between the polysilicon track and the surface region is formed.

As will be apparent from the description of the drawings, the zone of the protection diode which is connected to the gate, and the source and drain zones of the transistor can be formed simultaneously, while the connection between this zone and the gate is formed by depositing the first metal layer. As a result, extra process steps for manufacturing the diode are not necessary.

In the design of a circuit, a minimum distance between the gate on the one hand and drain contacts (or source contacts) on the other hand is customarily observed in accordance with design rules in order to preclude a short- circuit between these contacts and the gate. As a result of these design rules, in general, drain contacts overlapping the gate are impossible. If, in accordance with the invention, the protection diode and the gate contact each other in such a manner that they demonstrate an overlap, a substantial saving in space is achieved.

The conductor track may extend so as to be directly adjacent the neighboring region. Such an embodiment has advantages if the surface is flat or at least substantially flat. A preferred embodiment having the advantage that step-coverage problems are avoided when the surface is not flat, is characterized in that the conductor track projects above the neighboring region, only covers a part of this region and is separated from this region by an intermediate electrically insulating layer.

Further preferred embodiments of a semiconductor device in accordance with the invention are indicated in the subclaims.

These and other aspects of the invention will be apparent from and elucidated with reference to the embodiments described hereinafter.

Figure 1:
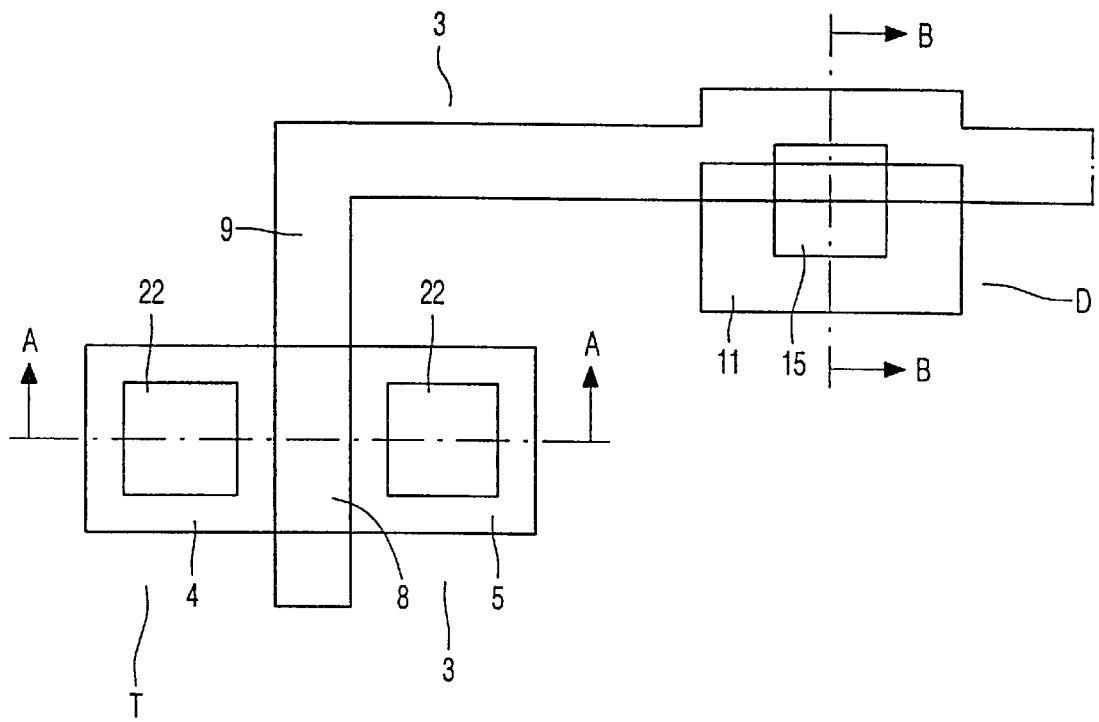
FIG. 1 is a schematic plan view of a semiconductor device in accordance with the invention.

It is noted that the drawing is schematical and not to scale. In the drawing, only a small part of an integrated circuit with a transistor and a protection diode is shown, but it will be obvious that the actual device is much larger and may comprise many thousands of transistors of both polarities. It is further noted that in the left half of FIGS. 2–5 sectional views of the device taken on the line A—A are shown, and in the right half a sectional view of the device taken on the line B—B in FIG. 1 is shown.

DESCRIPTION OF THE PREFERRED EMBODIMENT

Figure 2:
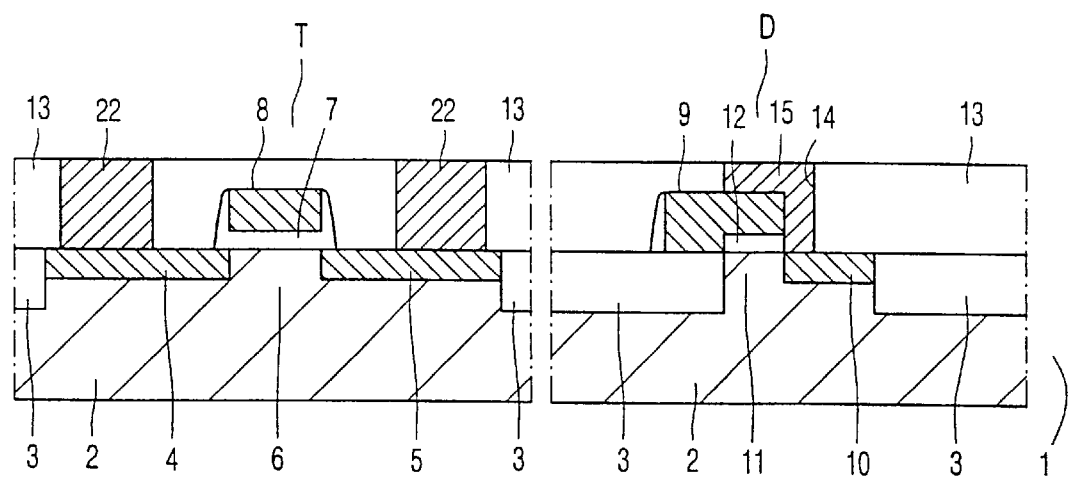
FIG. 2 shows sectional views of this device taken on the lines A—A and B—B.

The device in accordance with FIGS. 1 and 2 comprises a semiconductor body 1 of silicon having a suitable thickness and composition. Since, in this example, the invention is described by means of an n-channel MOST, the region 2 shown in the drawing and bordering the surface is a p-type region, but it will be obvious that the invention can also be applied to p-channel transistors having an n-type surface region 2. However, in the present example, the region 2 is a p-type region which may be formed by a p-type epitaxial layer deposited on a substrate or by a p-type well formed at the surface of the silicon body. At the surface, the silicon body 1 is provided with a field-oxide pattern 3 which defines active regions in the semiconductor body which accommodate the circuit elements of which, as mentioned hereinabove, only a transistor T and an associated protection diode D are shown. The transistor comprises an n-type source 4 and an n-type drain 5, which are separated from each other by a channel 6 which is covered by a thin gate dielectric 7 which is made, as customary, of silicon oxide, although it may of course also be made of another material or combination of materials. The thickness of the gate oxide is, for example, 10 nm. The transistor further comprises a gate 8, in this example of doped polycrystalline silicon, hereinafter referred to as poly for short.

To preclude that the thin gate oxide is damaged in the production process as a result of an electric charge on the gate 8, said gate is connected, via a conductor track 9, to the diode D which forms a protection diode via which the electric charge is removed before said damage can occur. For this purpose, the p-type region 2, which in this example constitutes the anode of the diode, is provided with an adjoining active region 11 in which an n-type surface zone 10 is provided. Said zone 10 constitutes the cathode of the diode and is conductively connected to the conductor track 9. If in a stage of the production process, a negative electric charge is stored on the gate, the pn-junction between the zones 10 and 11 can be forward biased, so that said charge can be removed via the region 2. In the case of a positive electric charge, the charge can be removed by breakdown across the pn-junction.

In accordance with the invention, the conductor 9 extends over the surface of the device at least almost up to the neighboring region 11, so that, viewed on the surface, the conductor 9 is situated next to the diode. In the present example, the polytrack 9 projects above a part of the active region 11 and is separated therefrom by an intermediate electrically insulating layer 12. The surface is covered with a relatively thick dielectric layer 13, in this example silicon oxide, in which, at the location of the diode, a contact window 14 is formed which extends above the n-type zone 10 and above the polytrack 9. An overlapping metal contact 15 forming a short-circuit between the poly track 9 and the n-type surface zone 10 of the diode is formed in the window 14.

Figure 3:
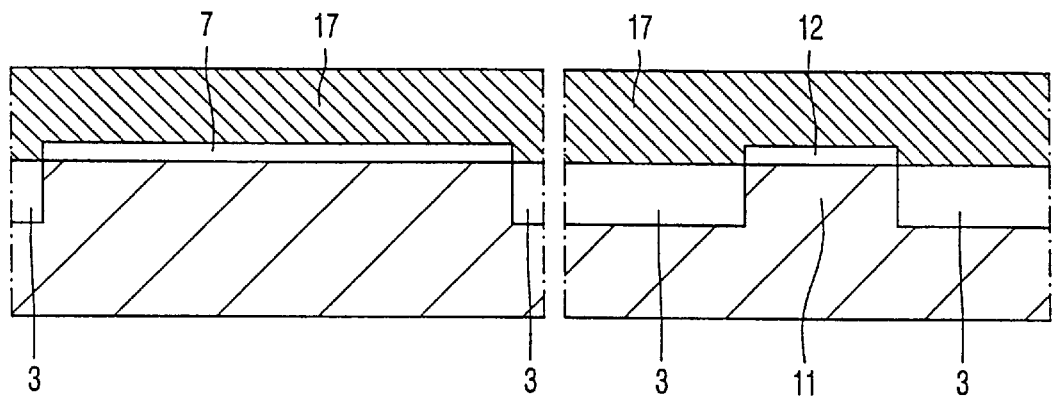
FIGS. 3–5 show the same sectional views of the device in various production stages.
Figure 4:
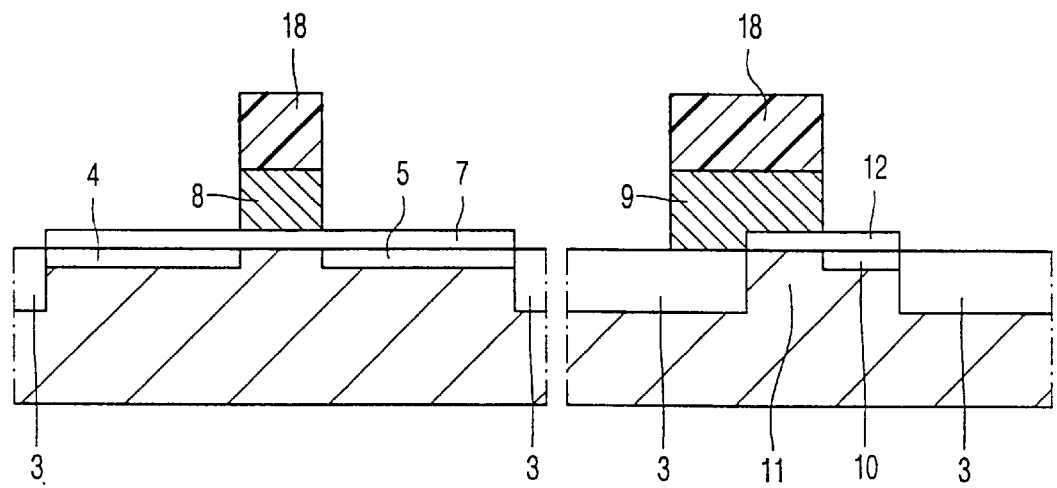
Figure 5:
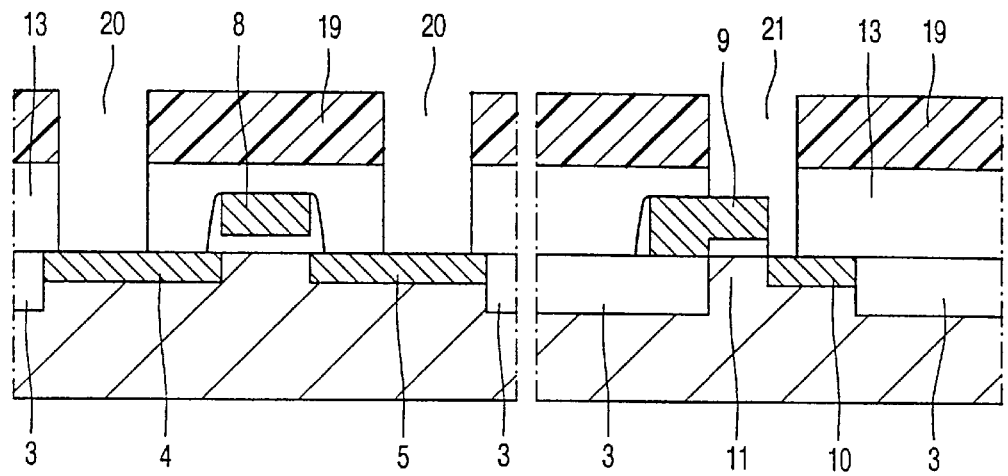

A few stages of a method of manufacturing this device will be described with reference to FIGS. 3–5, whereby it is noted that various stages, which are not relevant for a proper understanding of the invention, such as well-implantations, antipunch-through implantations etc., which are customary in standard processes, are not mentioned. FIG. 3 shows the stage in which the semiconductor body is provided with the field oxide 3 which defines the active regions in the semiconductor body. The pattern 3 can be manufactured in a manner which is known per se, for example by means of masked thermal oxidation (LOCOS). In the drawing, the oxide 3 is completely recessed in the semiconductor body. In other embodiments, the field oxide may partly project from the surface of the silicon body. Instead of using LOCOS for mutually insulating different circuit elements, it is of course alternatively possible to use grooves filled with a dielectric.

In a next stage, various implantation steps, not shown in the drawing, may be carried out, such as the well-implantation (n-type and/or p-type), channel stopper implantations, antipunch-through implantations, threshold-adjust implantations etc., and the 10 nm thick gate oxide 7 is grown by thermal oxidation on the surface at the location of the transistors to be formed. Simultaneously, the oxide layer 12 having the same thickness as the gate oxide 7 is formed at the location of the protection diode D. The surface is subsequently covered with an n-type doped layer 17 of poly having a thickness of approximately 1 μm.

In a subsequent stage, a mask 18 (see FIG. 4) is provided, whereafter the poly layer 17 is patterned by etching, so that the gate 8 and the conductor 9 are formed. Subsequently, for the source and drain zones of the transistors, an n-type doping such as As can be implanted so as to be self-aligned relative to the gate 8. In this example, the source and the drain are represented, for simplicity's sake, as single-implanted zones. It will be obvious however that these zones can also be embodied so as to be LDD zones (lightly doped drain), whereby, first the LDD portion of the zone or zones is provided by means of a light implantation and subsequently, after the side faces of the gate 8 are provided with spacers, a heavy implantation is carried out at some distance from the gate. In the p-type region 11, the implantation for the cathode 10 of the protection diode D is carried out at the same time as the implantation(s) of the source and drains of the transistors. As shown in FIG. 4, the zone 10 is aligned relative to the poly track 9. Subsequently, the photoresist layer 18 can be removed, whereafter the doping provided can be activated and implantation-damage to the crystal lattice repaired in the customary manner, by means of an annealing step.

In a next stage, the dielectric layer 13 is applied, for example in the form of an 1 μm thick oxide layer. On this layer, there is formed a photomask 19 (see FIG. 5) for the contacts, whereafter the contact windows 20 for the source and drain of the transistor, and the contact window 21 for the protection diode are formed by etching. To preclude a short-circuit between the gate 8 and the source/drain, the windows 20 are arranged, in accordance with customary design rules, at a sufficiently large distance from the gate, so that the source and drain contacts are laterally separated from the gate. In contrast to said design rules, the window 21 is provided in an overlapping manner, so that at the location of the diode both the zone 10 and the poly 9 are exposed. Subsequently, the photomask 19 is removed, whereafter, in a customary manner by depositing and etching a suitable metal such as Al, the metal contacts 22 are provided on the source and the drain, and the contact 15 forming the connection between the poly tracks 8 and 9 and the cathode 10 of the diode is provided. Next, the interconnections in the form of a multilayer metal wiring can be provided in a customary manner, whereby successive metal layers are separated from each other by an intermediate dielectric layer. To manufacture the interconnections use can be made of plasma-etching steps, whereby the risk of the gate oxide 7 being damaged is very small because the gate 8 is connected to the protection diode D. The diode D can be manufactured by means of the same process steps as the transistor and hence does not, or almost does not, render the process more complex. In addition, the use of the overlapping contact 15 advantageously enables the space occupied by the diode to be relatively limited, that is much more limited than it would be if the contact structure used for the diode was the same as that used for the source/drain zones of the transistors.

Figure 6:
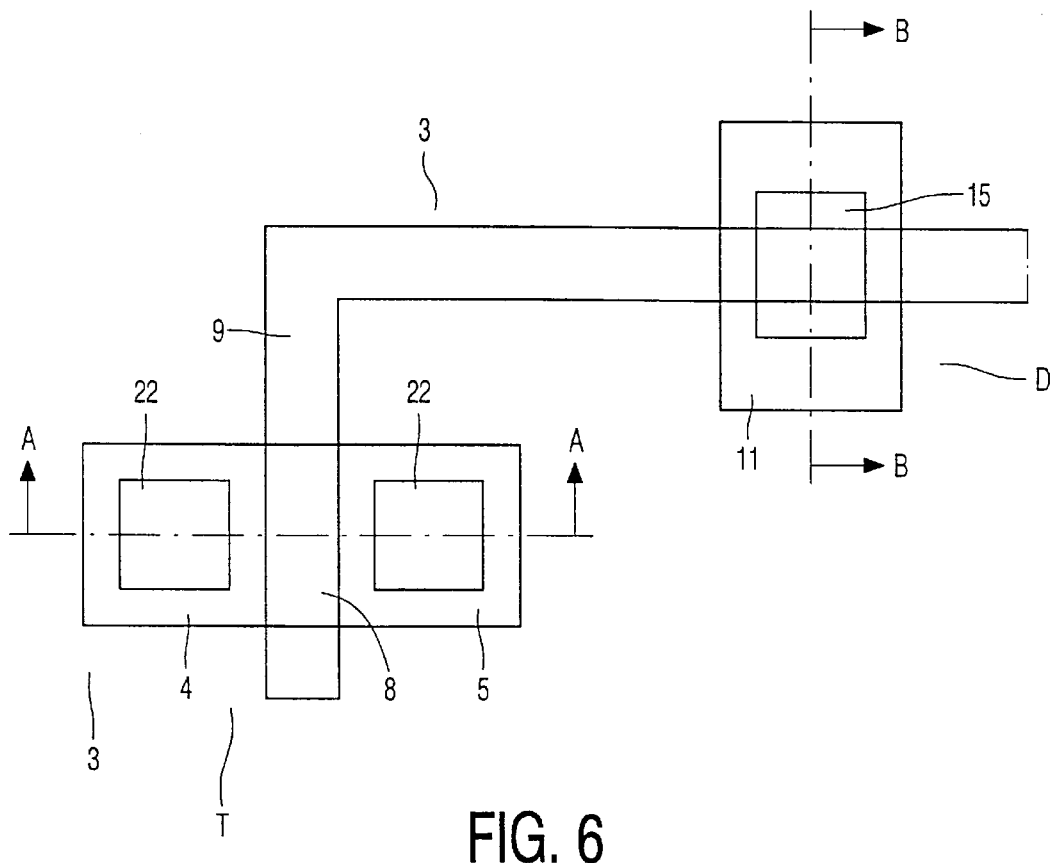
FIG. 6 is a plan view of a further embodiment of a semiconductor device in accordance with the invention.
Figure 7:
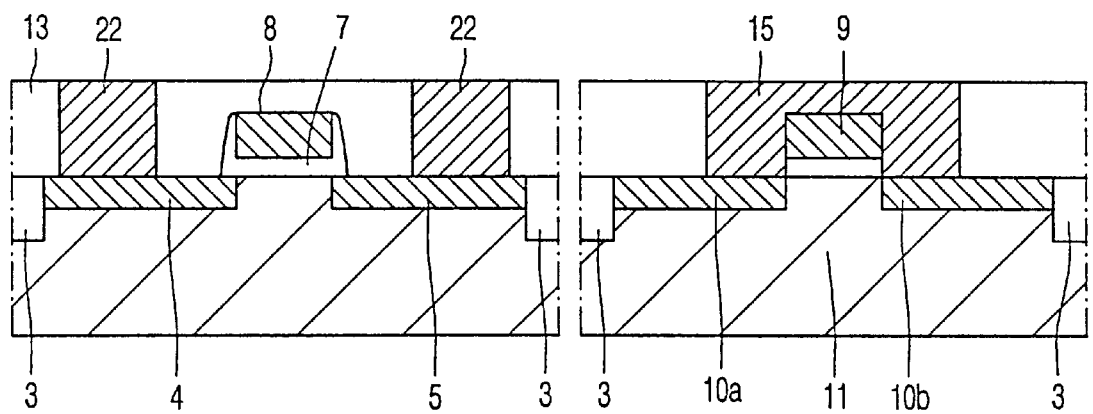
FIG. 7 shows sectional views of this device taken on the lines A—A and B—B in FIG. 6.

FIGS. 6 and 7 show a variant of the above-described configuration. Also in this case, the device comprises a transistor T of the same construction as transistor T in the preceding example. The gate 8 is connected to the cathode 10 of the protection diode D via the poly conductor track 9. Unlike the foregoing example, the conductor track 9 is situated above a central part of the active region 11, so that the source/drain doping causes mutually separated n-type sub-zones 10a and 10b to be formed on opposite sides of the track 9. These zones can both be short-circuited to the conductor track 9 and the poly gate 8 via the contact 15, and together form the cathode of the protection diode. The device may further be manufactured in the manner described by means of the preceding example.

In the example described here, both zones 10a and 10b are connected to the Al contact 15. In a variant, only a sub-zone is connected to the contact 15 and the poly track 9. The other zone may be floating or connected to a suitable node of the circuit.

Figure 8:
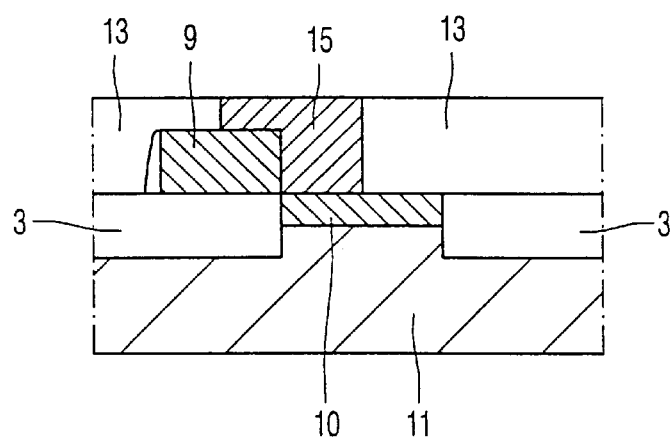
FIG. 8 is a sectional view of a third embodiment of a semiconductor device in accordance with the invention.

In the examples described hereinabove, the poly track 9 projects above the active region 11 and is separated therefrom by an oxide layer 12. If the surface is not flat, in this configuration, step-coverage problems occurring in the formation of the connection between the zone 10 and the poly track 9 can be precluded. Such a non-flat surface is often caused by the field oxide 3 if this field oxide partly projects above the silicon surface. If the surface is flat, the poly track 9 may alternatively be provided entirely next to the active region 11, as shown in FIG. 8. In this drawing, only a cross-sectional view of the protection diode D is shown. In this embodiment, the poly track 9 is entirely situated above the field oxide 3, while the zone 10 covers the entire surface area of the active region 11.

It will be obvious that the invention is not limited to the examples described herein, and that, within the scope of the invention, many variations are possible to those skilled in the art. For example, a similar protection can be used for p-channel MOS transistors. The poly material of the gate 8 and the poly track 9 may be p-type instead of n-type.

What is claimed is:

1. A semiconductor device comprising a semiconductor body which is provided at a surface with a MOS transistor having a gate which is electrically insulated from an underlying channel region by an intermediate gate dielectric, and, in a neighboring region of a first conductivity type, a surface zone of a second, opposite conductivity type is formed which is conductively connected to the gate and which forms a protection diode with the adjacent region of the semiconductor body, via which protection diode electric charge is removed from the gate before the gate dielectric is damaged as a result of electrostatic discharge, characterized in that the gate extends in the form of a conductor track over the surface at least almost up to the neighboring region, so that, viewed on the surface, the conductor track and the surface zone are juxtaposed, the entire surface being provided with a dielectric layer which is provided, at the location of the diode, with a contact window extending partly above the conductor track and partly above the surface zone, in which contact window a metal contact forming a conductive connection between the conductor track and the surface zone is formed.

2. A semiconductor device as claimed in claim 1, characterized in that the conductor track projects above the neighboring region, only covers a part of this region and is separated from this region by an intermediate electrically insulating layer.

3. A semiconductor device as claimed in claim 2, characterized in that the surface zone and the conductor track are aligned relative to each other.

4. A semiconductor device as claimed in claim 2, characterized in that, at the location of the diode, the electrically insulating layer has the same thickness and composition as the gate dielectric.

5. A semiconductor device as claimed in claim 1, characterized in that the gate and the conductor track are made of silicon, and the device is provided with a multilayer metal wiring, said metal contact between the diode and the gate being formed in the first metal layer.

* * * * *